(12) United States Patent
Cheong et al.

(10) Patent No.: US 8,786,484 B2
(45) Date of Patent: Jul. 22, 2014

(54) ANALOGUE TO DIGITAL CONVERTER, AN INTEGRATED CIRCUIT AND MEDICAL DEVICE

(75) Inventors: Jiahao Cheong, Singapore (SG); Pradeep Basappa Khannur, Singapore (SG); Kok Lim Chan, Singapore (SG); Minkyu Je, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/699,681

(22) PCT Filed: May 25, 2011

(86) PCT No.: PCT/SG2011/000194
§ 371 (c)(1),
(2), (4) Date: Feb. 4, 2013

(87) PCT Pub. No.: WO2011/149428
PCT Pub. Date: Dec. 1, 2011

(65) Prior Publication Data
US 2013/0147649 A1    Jun. 13, 2013

(30) Foreign Application Priority Data

May 26, 2010    (SG) .............................. 201003696-0

(51) Int. Cl.
*H03M 1/12*    (2006.01)
(52) U.S. Cl.
CPC ........................................ *H03M 1/12* (2013.01)
USPC .......................................... 341/172; 341/155
(58) Field of Classification Search
CPC ....................................................... H03M 1/12
USPC .................................. 341/155, 172, 166, 162
See application file for complete search history.

(56) References Cited

U.S. PATENT DOCUMENTS

| | | | |
|---|---|---|---|
| 4,764,753 A * | 8/1988 | Yukawa | 341/166 |
| 6,559,789 B1 * | 5/2003 | Somayajula | 341/172 |
| 6,707,403 B1 | 3/2004 | Hurrell | |
| 6,954,170 B2 | 10/2005 | Leung | |

(Continued)

OTHER PUBLICATIONS

Ogawa, et al., An SAR ADC Algorithm with Redundancy and Digital Error Correction, The 22nd Workshop on Circuits and Systems, 66 (2009).

(Continued)

*Primary Examiner* — Jean B Jeanglaude
(74) *Attorney, Agent, or Firm* — K. David Crockett, Esq.; Niky Economy Syrengelas, Esq.; Crockett & Crockett, PC

(57) ABSTRACT

An analogue to digital converter includes a first input connection to receive a first part of the analogue input signal, a second input connection to receive a second part of the analogue input signal, a first and second plurality of capacitors, each capacitor of the first plurality of capacitors forms a capacitor pair with a corresponding capacitor in the second plurality of capacitors During a sampling period, the first input connection couples the first part of the analogue input signal to a first contact of each capacitor of the first plurality of capacitors and the second input connection couples the second part of the analogue input signal to a first contact of each capacitor of the second plurality of capacitors. Further, a switching array couples a second contact of each capacitor of the first and second plurality of capacitors to a common mode voltage to determine a first bit of a digital output signal.

20 Claims, 17 Drawing Sheets

(56) References Cited

U.S. PATENT DOCUMENTS

| | | | |
|---|---|---|---|
| 7,023,372 B1 * | 4/2006 | Singh et al. | 341/155 |
| 7,030,804 B2 * | 4/2006 | Yoshioka et al. | 341/172 |
| 7,286,075 B2 * | 10/2007 | Hennessy et al. | 341/172 |
| 7,589,659 B2 * | 9/2009 | Hurrell | 341/163 |
| 7,675,452 B2 * | 3/2010 | Madhavan et al. | 341/162 |
| 2005/0258998 A1 * | 11/2005 | Confalonieri et al. | 341/172 |
| 2010/0026546 A1 | 2/2010 | Ohnhaeuser et al. | |

OTHER PUBLICATIONS

Franz Kuttner, A 1.2V 10b 20MSample/s Non-Binary Successive Approximation ADC in 0.13um CMOS, IEEE International Solid-State Circuits Conference (2002).

Ogawa, et al., SAR ADC Algorithm with Redundancy, IEEE Asia Pacific Conference on Circuits and Systems, 268 (2008).

Chen, et al., A 9b 100MS/s 1.46mW SAR ADC in 65nm CMOS, IEEE Asian Solid-State Circuits Conference, 145 (2009).

Lee, et al., A 1.3uW 0.6V 8.7-ENOB Successive Approximation ADC in a 0.18um CMOS, Symposium on VLSI Circuits Digest of Technical Papers, 242 (2009).

Elzakker, et al., A 1.9uW 4.4fJ/Conversion-Step 10b 1MS/s Charge-Redistribution ADC, IEEE International Solid-State Circuits Conference, 244 (2008).

Liu, et al., A 10b 100MS/s 1.13mW SAR ADC with Binary-Scaled Error Compensation, IEEE International Solid-State Circuits Conference, 386 (2010).

Hong, et al., A 65-fJ/Conversion-Step 0.9-V 200-kS/s Rail-to-Rail 8-bit Successive Approximation ADC, 42 IEEE Journal of Solid-State Circuits, 2161 (2007).

Agnes, et al., A 9.4-ENOB 1V 3.8μW 100kS/s SAR ADC with Time-Domain Comparator, IEEE International Solid-State Circuits Conference, 246 (2008).

Abdelhalim, et al., A Nanowatt Successive Approximation ADC with a Calibrated Capacitor Array for Biomedical Applications, Midwest Symposium on Circuits and Systems, 136 (2007).

* cited by examiner

| | |
|---|---|
| Supply voltage | 1V |
| Sampling rate | 100 kS/s |
| Resolution | 10 bits |
| SNDR | 53.05 dB |
| SFDR | 59 dBc |
| ENOB | 8.5 bits |
| INL | ±0.5LSB |
| DNL (no missing codes) | ±0.5LSB |
| Full-Scale Input Range (differential) | 1Vpp |
| Power | 0.69uW |
| FOM | 19.05fJ/conversion-step |

Fig. 9

| Manufacture/Research Group | Uni. Of Twente (Netherlands) ISSCC 2008 | National Cheng-Kung Uni. (Taiwan) ISSCC 2010 | POSTECH (Korea) VLSI Symposium 2009 | National Chiao Tung Uni. (Taiwan) JSSC 2007 | IME |
|---|---|---|---|---|---|
| Technology | 65nm | 65nm | 0.18μm | 0.18μm | 0.18μm |
| Sampling speed | 1MS/s | 100MS/s | 100KS/s | 200KS/s | 100KS/s |
| Resolution | 10bit | 10bit | 10bit | 8bit | 10bit |
| ENOB | 8.9bit | 9bit | 8.7bit | 7.44bit | 8.5bit |
| Power | 1.9μW | 1.13mW | 1.3μW | 2.47μW | 0.7μW |
| FOM | 4.4fJ/Step | 15.5fJ/Step | 3fJ/Step | 65fJ/step | 19fJ/Step |

Fig. 10

| | |
|---|---|
| Supply voltage | 1V |
| Sampling rate | 80kS/s |
| Resolution | 10 bits |
| SNDR | 53.28dB @ 5kHz input<br>46.11dB @ 25kHz input |
| SFDR | 61.1dB @ 5kHz input<br>50.7dB @ 25kHz input |
| ENOB | 8.6bits @ 5kHz input<br>7.4bits @ 25kHz input |
| INL | ±1.5LSB |
| DNL | ±0.6LSB |
| Full-Scale Input Range | 1Vpp |
| Power | 0.4uW |
| FOM | 19.5fJ/conversion-step |

Fig. 16

ANALOGUE TO DIGITAL CONVERTER, AN INTEGRATED CIRCUIT AND MEDICAL DEVICE

CROSS-REFERENCE TO RELATED APPLICATION

This application claims the benefit of priority of Singapore application No. 201003696-0, filed 26 May 2010, the content of it being hereby incorporated by reference in its entirety for all purposes.

TECHNICAL FIELD

Example embodiments relate to an analogue to digital converter, an integrated circuit and a medical device.

BACKGROUND

Analogue-to-digital converters are usually electronic devices. Typically, an analogue-to-digital converter operates on an analogue input signal to convert it into a digital output signal. In other words, the analogue-to-digital converter may receive a continuous signal and convert it into a discrete signal. Analogue-to-digital converters may be used to convert an analogue signal from an analogue electronic device into a digital signal, so that the information contained within the analogue signal can be received by a digital electronic device.

One type of analog-to-digital converter is known as a successive approximation analogue-to-digital converter. Typically, a successive approximation analogue-to-digital converter converts a continuous analog signal into a corresponding discrete digital signal using a binary search. Specifically, the device may search through all possible quantization levels before finally converging upon a digital output which best matches the analogue signal.

SUMMARY

In various embodiments, an analogue-to-digital converter for converting an analogue input signal into a digital output signal is provided. The analogue-to-digital converter may include: a first input connection configured to receive a first part of the analog input signal; a second input connection configured to receive a second part of the analogue input signal; a first plurality of capacitors and a second plurality of capacitors, each capacitor of the first and second plurality of capacitors having a first contact and a second contact, each capacitor of the first plurality of capacitors having a corresponding capacitor in the second plurality of capacitors to form a plurality of capacitor pairs; a switching array coupled to the second contact of each capacitor in the first and second plurality of capacitors; and, switching logic for controlling the switching array; wherein, during a sampling period of the analogue-to-digital converter, the first input connection is configured to couple the first part of the analogue input signal to the first contact of each capacitor of the first plurality of capacitors, the second input connection is configured to couple the second part of the analogue input signal to the first contact of each capacitor of the second plurality of capacitors, and the switching logic is configured to cause the switching array to couple the second contact of each capacitor of the first and second plurality of capacitors to a common mode voltage to determine a first bit of the digital output signal.

In various embodiments, an integrated circuit including the above-described analogue-to-digital converter is provided.

In various embodiments, a medical device which may include the above-described analogue-to-digital converter, or the above-described integrated circuit, is provided.

BRIEF DESCRIPTION OF THE DRAWINGS

In the drawings, like reference characters generally refer to like parts throughout the different views. The drawings are not necessarily to scale, emphasis instead generally being placed upon illustrating the principles of some example embodiments of the invention. In the following description, various example embodiments of the invention are described with reference to the following drawings, in which:

FIGS. 7 to 10 are simulation results relating to one example embodiment;

FIGS. 11 to 16 are experimental results relating to the example embodiment.

DETAILED DESCRIPTION

Figure 1:
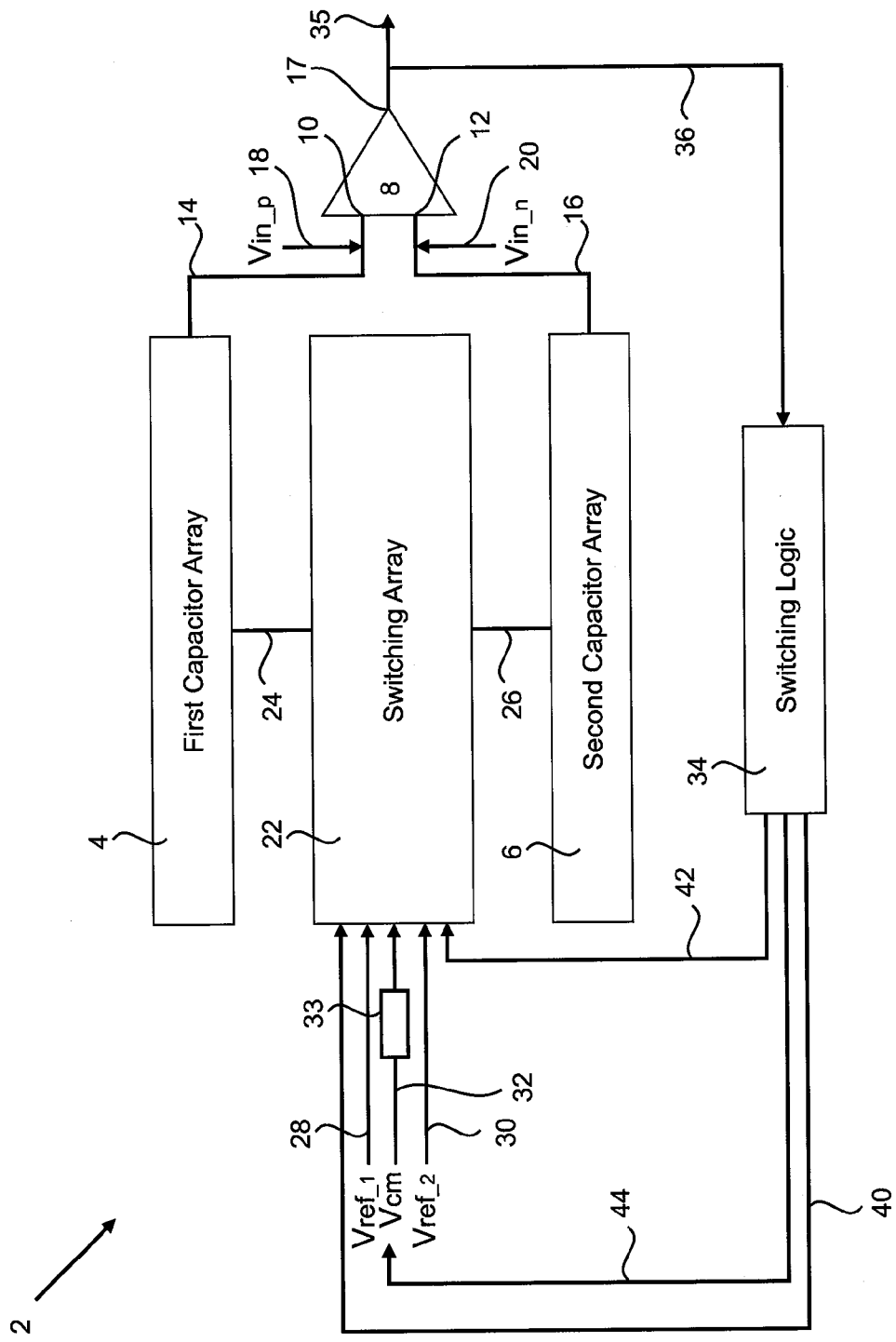
FIG. 1 is a schematic diagram of an analogue-to-digital converter according to an example embodiment.

The following detailed description refers to the accompanying drawings that show, by way of illustration, specific details and example embodiments. These example embodiments are described in sufficient detail to enable those skilled in the art to practice the invention. Other example embodiments may be utilized and structural, logical, and electrical changes may be made without departing from the scope of the appended claims. The various example embodiments are not necessarily mutually exclusive, as some example embodiments can be combined with one or more other example embodiments to form new example embodiments.

In various embodiments, an analogue-to-digital converter for converting an analogue input signal into a digital output signal is provided. The analogue-to-digital converter may include: a first input connection configured to receive a first part of the analog input signal; a second input connection configured to receive a second part of the analogue input signal; a first plurality of capacitors and a second plurality of capacitors, each capacitor of the first and second plurality of capacitors having a first contact and a second contact, each capacitor of the first plurality of capacitors having a corresponding capacitor in the second plurality of capacitors to form a plurality of capacitor pairs; a switching array coupled to the second contact of each capacitor in the first and second plurality of capacitors; and, switching logic for controlling the switching array; wherein, during a sampling period of the analogue-to-digital converter, the first input connection is configured to couple the first part of the analogue input signal to the first contact of each capacitor of the first plurality of capacitors, the second input connection is configured to couple the second part of the analogue input signal to the first contact of each capacitor of the second plurality of capacitors, and the switching logic is configured to cause the switching array to couple the second contact of each capacitor of the first and second plurality of capacitors to a common mode voltage to determine a first bit of the digital output signal.

In an example embodiment, during a conversion period of the analogue-to-digital converter, the switching logic is configured to cause the switching array to couple each second contact of at least one capacitor pair to a different one of a first and a second reference voltage, and to couple the other capacitors in capacitor pairs via their second contacts to determine subsequent bits of the digital output signal. In an example embodiment, the first reference voltage is higher than the second reference voltage.

In an example embodiment, during the conversion period of the analogue-to-digital converter, the switching logic is configured to cause the switching array to couple each second contact of a first capacitor pair to a different one of the first and the second reference voltage depending on the determination of the first bit of the digital output signal, and to couple in pairs any succeeding capacitor pairs to determine a second bit of the digital output signal. In an example, the first and the second plurality of capacitors may include eleven capacitor pairs. During the conversion period, each second contact of the first capacitor pair is connected to a different one of the first and the second reference voltage. For example, the second contact of one of the pair is connected to the first reference voltage whilst the second contact of the other capacitor in the pair is connected to the second reference voltage, or visa versa, depending on the determination of the first bit. Furthermore, any succeeding capacitor pairs (i.e. the second to the tenth pair) are connected in capacitor pairs via their second contacts, to determine a second bit. Therefore, 'succeeding capacitor pairs' is taken to mean 'following' capacitor pairs, i.e. in the above example, the succeeding capacitor pairs relating to the fourth capacitor pair are the fifth to eleventh capacitor pairs.

In an example embodiment, during the conversion period of the analogue-to-digital converter, the switching logic is configured to cause the switching array to couple each second contact of an ith capacitor pair to a different one of the first and the second reference voltage depending on a determination of an ith bit of the digital output signal, and to couple in pairs any succeeding capacitor pairs to determine an (i+1)th bit of the digital output signal. Therefore, considering the above example including eleven capacitor pairs, each second contact of a third capacitor pair is connected to a different one of the first and the second reference voltage depending on the determination of the third bit of the digital output signal, and the third to eleventh capacitor pairs are connected in capacitor pairs via their second contacts to determine the fourth bit of the digital output signal. The first and second capacitor pairs are left as configured after determination of the first three bits. In various embodiments, "i" may be an arbitrary integer value.

In an example embodiment, during the conversion period of the analogue-to-digital converter, the first input connection is configured to decouple the first part of the analogue input signal from the first contact of each capacitor of the first plurality of capacitors, the second input connection is configured to decouple the second part of the analogue input signal from the first contact of each capacitor of the second plurality of capacitors.

In an example embodiment, the switching array is configured to selectively couple the second contact of each capacitor in the first plurality of capacitors to one of the first reference voltage, the second reference voltage, the common mode voltage and its corresponding capacitor in the second plurality of capacitors, and to selectively couple the second contact of each capacitor in the second plurality of capacitors to one of the first reference voltage, the second reference voltage, the common mode voltage, and its corresponding capacitor in the first plurality of capacitors.

In an example embodiment, the analogue-to-digital converter further includes a comparator having a first input terminal coupled to the first contact of each capacitor of the first plurality of capacitors, and a second input terminal coupled to the first contact of each capacitor of the second plurality of capacitors.

In an example embodiment, the comparator further includes an output, wherein the switching logic is configured to control the switching array in dependence on the comparator output.

In an example embodiment, the analogue-to-digital converter is configured to determine bits of the digital output signal in dependence on the comparator output.

In an example embodiment, the comparator is a time-domain comparator including voltage controlled delay circuitry configured to convert a voltage level of the time-domain comparator to a delay of a clock signal, and phase detection circuitry configured to determine which of the signals input on the first input terminal and the second input terminal changes earlier.

In an example embodiment, the first plurality of capacitors may include capacitance values in a non-binary weighted relationship.

In an example embodiment, the second plurality of capacitors may include capacitance values in a non-binary weighted relationship.

In an example embodiment, both capacitors of a capacitor pair have the same capacitance.

In an example embodiment, the digital output signal includes N bits and each of the first plurality of capacitors and the second plurality of capacitors may include more than N+1 capacitors to provide redundancy. In various embodiments, "N" may be an arbitrary integer value.

In an example embodiment, the second reference voltage is ground.

In an example embodiment, the analogue-to-digital converter further includes a reset switch, wherein the switching logic is configured to cause the reset switch to regulate the common mode voltage.

In an example embodiment, the first bit is a most significant bit of the digital output signal.

In an example embodiment, the first part of the analogue input signal and the second part of the analogue input signal may include the analogue input signal in differential form.

In an example embodiment, the first reference voltage is selected to be equal to a common mode voltage of the analogue input signal in differential form, such that capacitors that are coupled in pairs have a value of half of the first reference voltage at their second contact during the conversion period.

In an example embodiment, the analogue-to-digital converter is a successive approximation analogue-to-digital converter.

In various embodiments, an integrated circuit including the analogue-to-digital described above may be provided.

In various embodiments, a medical device comprising the analogue-to-digital described above, or the integrated circuit described above, may be provided.

Figure 17:
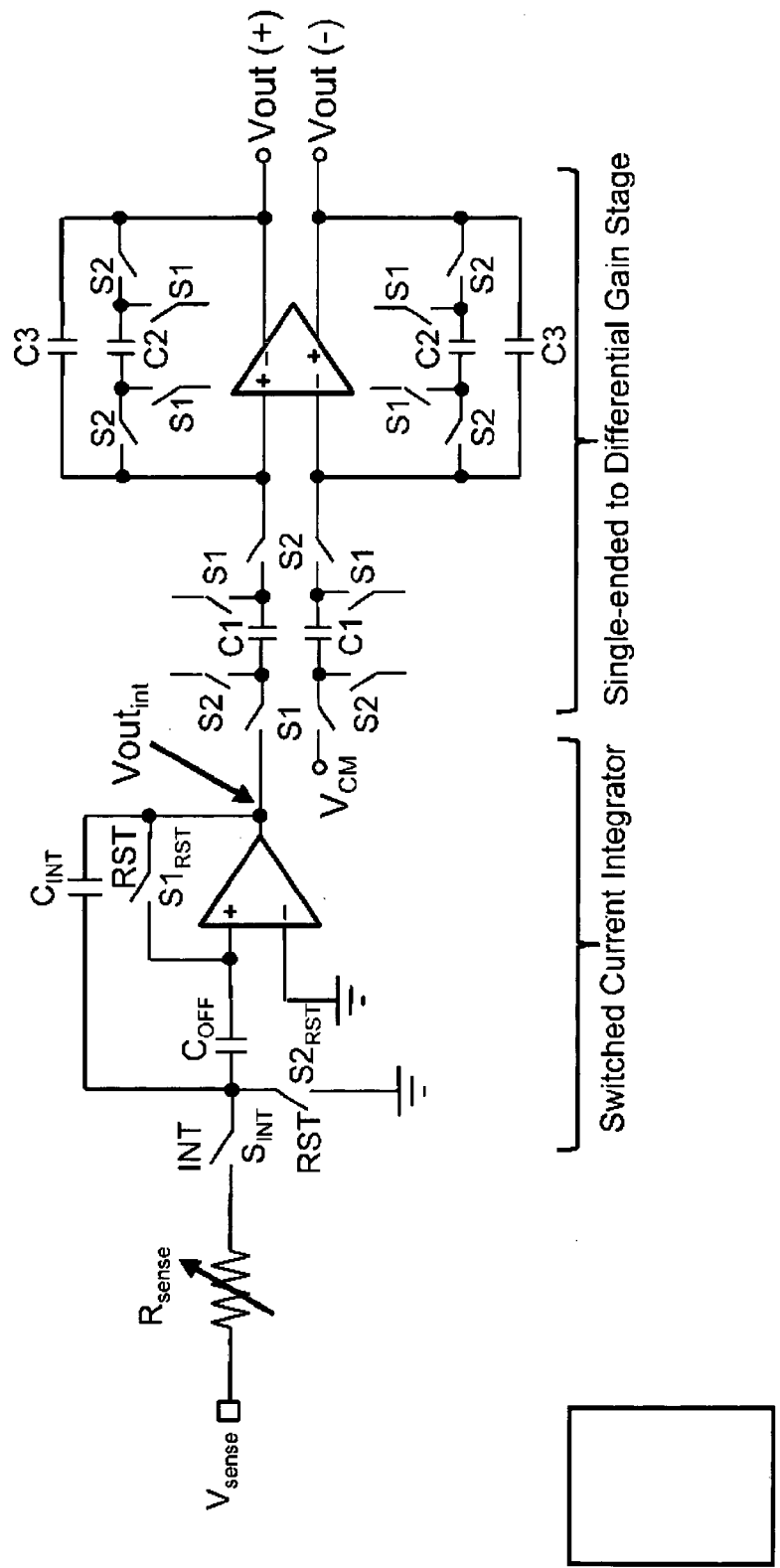
FIG. 17 is a schematic diagram of an exemplary circuit for providing a differential voltage input.

FIG. 1 illustrates an analogue-to-digital converter (ADC) 2 according to an example embodiment. The ADC 2 may include a first capacitor array 4 and a second capacitor array 6. Within the present example embodiment, the first capacitor array 4 provides a first plurality of capacitors, whereas the second capacitor array 6 provides a second plurality of capacitors. The ADC 2 may further include a comparator 8 having a first input terminal 10 and a second input terminal 12. The first input terminal 10 of the comparator 8 is connected to the first capacitor array 4 by a connecting element 14, whereas the second input terminal 12 of the comparator 8 is connected to the second capacitor array 6 by a connecting element 16. The comparator 8 may further include an output terminal 17 which is discussed further below. The connecting element 14 is also connected to a first switchable input connection 18, and the connecting element 16 is also connected to a second switchable input connection 20. The first and second switchable input connections may be switchable between an 'on' configuration and an 'off' configuration. In the 'on' configuration, a signal present on a switchable input connection is input to the corresponding connecting element. In the 'off' configuration, a signal present on a switchable input connection is not input to the corresponding connecting element. The first and second switchable input connections 18, 20 are configured to receive an analogue input signal in two parts. In an example embodiment, the analogue input signal is received in differential form. In an example embodiment, the potential of Vin_p and Vin_n may be within the range from 0.25V to 0.75V, resulting in a differential input dynamic range of 1V. In an example embodiment, the input signal of the ADC may be generated by a sensor interface circuit, such as, for example, the circuit of FIG. 17. In an example embodiment, the circuit of FIG. 17 relates to a blood flow sensor biomedical application. As can be seen from FIG. 17, the circuit receives an input voltage signal Vsense which is then passed though a variable resistor Rsense. The circuit of FIG. 17 then comprises two stages, a first switched current integrator stage followed by a single-ended to differential gain stage. Differential voltages Vout(+) and Vout(−) which correspond to input voltage Vsense are provided as outputs from the single-ended to differential gain stage.

The ADC 2 may further include a switching array 22 which is connected to the first capacitor array 4 by a connecting element 24 and to the second capacitor array 6 by a connecting element 26. The switching array 22 is in communication with three signals, a first signal Vref_1, a second signal Vref_2 and a third signal Vcm. The first signal Vref_1 is provided to the switching array 22 via a connecting element 28. The second signal Vref_2 is connected to the switching array 22 via a connecting element 30. The third signal Vcm is connected to the switching array 22 via a connecting element 32. The first signal Vref_1 provides a first reference voltage, the second signal Vref_2 provides a second reference voltage and the third signal Vcm provides a common mode voltage. A Vcm signal line 32 may also include a reset switch 33 configured to switch between an 'on' configuration and an 'off' configuration. In the 'on' configuration, the third signal Vcm is provided to the switching array 22, whereas in the 'off' configuration the third signal Vcm is not provided to the switching array 22.

As mentioned briefly above, the comparator 8 may include an output terminal 17. The output terminal 17 provides an output signal of the ADC 2 at an ADC output terminal 35. Also, the output terminal 17 of the comparator 8 is connected to switching logic 34 via a connecting element 36. The switching logic 34 provides a switching control signal via connecting elements 40 and 42 to switching array 22. The switching logic 34 controls the operation of the switching array 22 via the control signal. The switching logic 34 also provides a reset signal via connecting element 44 to the reset switch 33. The switching logic 34 controls the reset switch 33 via the reset signal Each capacitor of the first capacitor array 4 may include a first contact and a second contact. The first contact of each capacitor of the first array 4 is coupled to the connecting element 14. The second contact of each capacitor of the first array 4 is coupled to the switching array 22 via the connecting element 24. Furthermore, each capacitor of the second capacitor array 6 may include a first contact and a second contact. The first contact of each capacitor of the second array 6 is coupled to the connecting element 16. The second contact of each capacitor of the second array 6 is coupled to the switching array 22 via the connecting element 26. Each capacitor of the first capacitor array 4 has a corresponding capacitor in the second capacitor array 6 in order to form a plurality of capacitor pairs.

The switching array 22 is configured to selectively connect the second contact of each capacitor in the first capacitor array 4 to one of Vref_1, Vref_2, Vcm and its corresponding capacitor in the second capacitor array 6. Additionally, the switching array 22 is configured to selectively connect the second contact of each capacitor in the second capacitor array 6 to one of Vref_1, Vref_2, Vcm and its corresponding capacitor in the first capacitor array 4.

Figure 2:
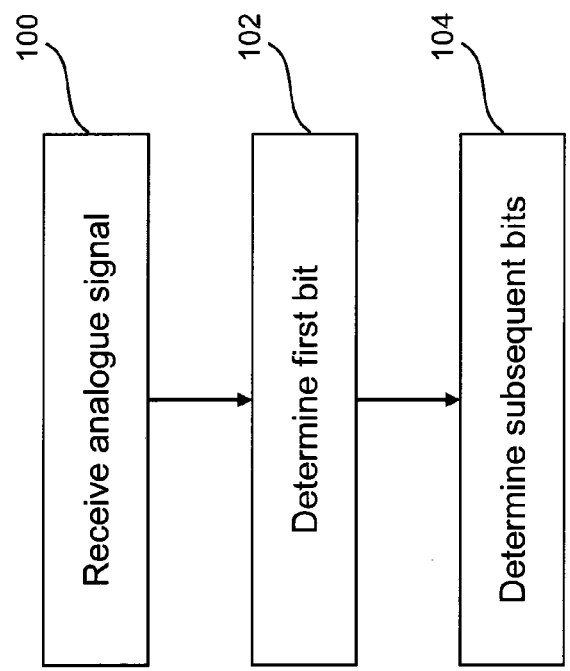
FIG. 2 is a flow diagram of the operation of the analogue-to-digital converter of FIG. 1.

FIG. 2 is a flow diagram of a method of converting an analogue input signal into a digital output signal using the ADC 2 of FIG. 1. In the flow diagram of FIG. 2, processing begins in 100.

In 100, the analogue input signal in two parts is input to the first and second switchable input connections. For example, the input signal may be input to the first and second switchable input connections in differential form. Processing then flows to 102, which defines a sampling period. In 102, the first and second switchable input connections 18 and 20 are turned to the 'on' configuration. Accordingly, the first contact of each capacitor in the first capacitor array 4 receives the input signal present on the first switchable input connection 18, and the first contact of each capacitor in the second array 6 receives the signal present on the second switchable input connection 20. Furthermore, the switching logic 34 causes the switching array 22 to connect the second contact of each capacitor of the first and second capacitor arrays 4, 6 to the Vcm signal. It is noted that in order for this to be achieved, the switching logic 34 should cause the reset switch 33 to be in the 'on' configuration. According to this operation, the ADC 2 determines a first bit of the digital result during the sampling period. Specifically, the signal provided at the output 17 of the comparator 8 indicates which input signal present on comparator inputs 10 and 12 is largest. Depending on which signal present at the first comparator input 10 and the second comparator input 12, is largest the first bit of the digital output signal of the comparator will be a '1' or a '0'. This first bit of the digital output signal is provided at ADC output terminal 35. Processing then flows to 104, which defines a conversion period.

In 104, subsequent bits of the digital result are determined during conversion cycles. In particular, the switching logic 34 is configured to cause the switching array 22 to connect each second contact of at least one capacitor pair to a different one of the first signal Vref_1 and the second signal Vref_2. Therefore, considering each capacitor pair making up the 'at least one capacitor pair', the second contact of one capacitor in the pair is connected to the first signal Vref_1 whilst the second contact of the other capacitor in the pair is connected to the second signal Vref_2, or visa versa. It is to be understood that different capacitor pairs of the 'at least one capacitor pair' may be connected in different configurations.

Also during the configuration period, the switching logic 34 is configured to cause the switching array 22 to connect the other capacitors (i.e. those not included in the 'at least one capacitor pair') in capacitor pairs. Specifically, the other capacitors are connected in capacitor pairs via their second contacts.

Also during the conversion period, the first and second switchable input connections may be turned to the 'off' configuration. Accordingly, the first contact of each capacitor of the first array 4 is connected to the first input terminal 10 of the comparator 8, and the first contact of each capacitor of the second array 6 is connected to the second input terminal 12 of the comparator 8.

According to the above operation of the configuration period, the output of the comparator 8 provides a subsequent bit of the digital output signal. Therefore, the subsequent bit of the digital output result is present at the ADC output terminal 35. It is to be understood that the above operation can be used to determine each subsequent bit of the digital output signal. In various embodiments, the number of capacitor pairs which are connected to the reference voltages (i.e. the number of capacitor pairs making up the 'at least one capacitor pair') determines which bit of the digital output signal is output. For example, if one capacitor pair is connected to the reference voltages, the above operation determines the second bit of the digital output signal. Alternatively, if two capacitor pairs are connected to the reference voltages, the above operation determines the third bit of the digital output signal. Alternatively, if three capacitor pairs are connected to the reference voltages, the above operation determines the fourth bit of the digital output signal. Alternatively, if four capacitor pairs are connected to the reference voltages, the above operation determines the fifth bit of the digital output signal. It is noted that the first bit was determined during the sampling period (102). It can therefore be seen how the above operation can be used to determine each bit of the digital output signal.

Figure 3:
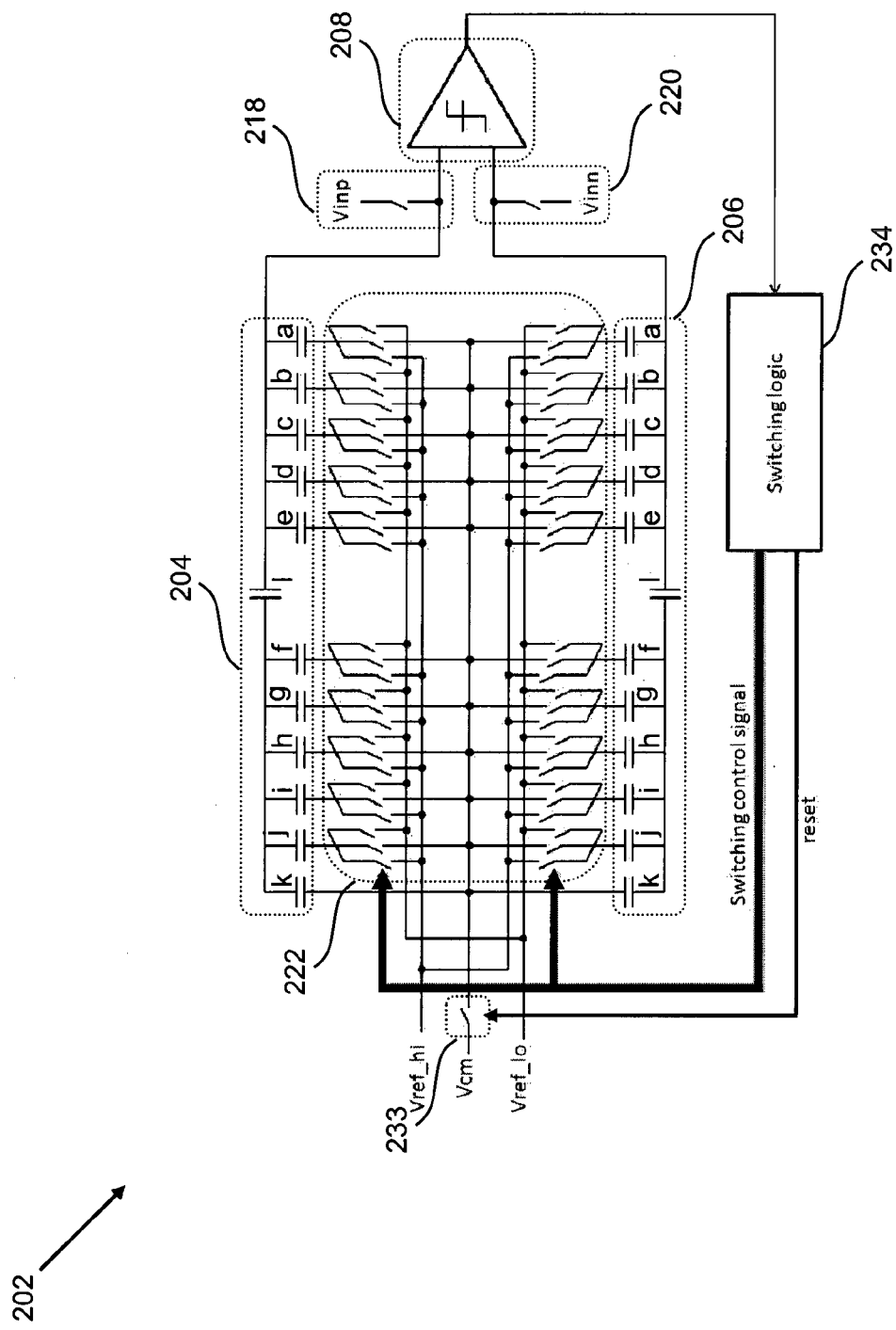
FIG. 3 is a schematic diagram of an analogue-to-digital converter according to an example embodiment.

FIG. 3 illustrates an ADC 202 according to an example embodiment.

In various embodiments, the ADC 202 may include the following features: a first capacitor array 204, a second capacitor array 206, a comparator 208, a first switchable input connection 218, a second switchable input connection 220, a switching array 222, switching logic 234 and a reset switch 233. These features of ADC 202 are connected together in an analogous way to the corresponding features of ADC 2 of FIG. 1. Additionally, the switching array 222 receives three signals, a first signal Vref_hi, a second signal Vref_lo and a third signal Vcm. The first signal Vref_hi and the second signal Vref_lo provide two references voltages, whereas the third signal Vcm provides a common mode voltage. Furthermore, the first and second switchable input connections 218 and 220 are configured to receive an analogue input signal in two-part form, for example, differential form. It is noted that the ADC 202 including these additional features is still analogous to ADC 2 of FIG. 1 described above.

The following describes the arrangement of the first capacitor array 204 and the second capacitor array 206. The first capacitor array 204 may include a first plurality of ten capacitors 'a' to 'j' arranged in parallel formation. The first plurality of capacitors may include a most-significant-bit (MSB) group of capacitors 'a' to 'e' positioned along side a least-significant-bit (LSB) group of capacitors 'f' to 'j'. Each capacitor 'a' to 'j' of the first plurality of capacitors may include a first contact and a second contact. Each first contact is connected via a common connection line to the first switchable input connection 218 and the first input of the comparator 208. Each second contact is connected to the switching array 222. The first capacitor array 204 may further include an attenuation capacitor 'l' which is arranged on the common connection line so that the size of the MSB group of capacitors can be reduced while achieving the same equivalent capacitance, reducing the input load capacitance of the ADC 202. The first capacitor array 204 may further include a capacitor 'k' positioned in parallel formation with the LSB group of capacitors 'f' to 'j' and adjacent capacitor 'j'. A first contact of the capacitor 'k' is connected to the common connection line. The capacitor 'k' may be used to adjust the weightage of the capacitor so that the switching of a unit capacitor will result in 1 LSB of voltage change. The arrangement of the second capacitor array 206 is analogous to the above-described arrangement of the first capacitor array 204. Accordingly, the second capacitor array may include a second plurality of capacitors 'a' to 'j'. It is further noted that the capacitor 'k' of the first capacitor array 204 is connected to the capacitor 'k' of the second capacitor array 206 via their respective second contacts.

The following describes the arrangement of the switching array 222. As mentioned above, the second contact of each of the first plurality of capacitors is connected to the switching array 222. Therefore, by analogy, the second contact of each of the second plurality of capacitors is also connected to the switching array 222. The connection between each second contact and the switching array 222 is as follows. The switching array is configurable to selectively connect a second contact with one of the signals Vref_hi, Vref_lo, Vcm, and a corresponding second contact in the other plurality of capacitors. For example, the second contact of capacitor 'b' of the first plurality may be selectively connected to either one of the signals Vref_hi, Vref_lo, Vcm or the second contact of capacitor 'b' of the second plurality. Additionally, the second contact of capacitor 'c' of the second plurality may be selectively connected to either Vref_hi, Vref_lo, Vcm or the second contact of capacitor 'c' of the first plurality.

The ADC 202 operates as follows to convert an analogue input signal to a digital output signal. During a sampling period of the ADC 202, the first switchable input connection 218 is configured to connect the first contact of each capacitor of the first plurality of capacitors via the common connection line of array 204. Additionally, the second switchable input connection 220 is configured to connect the first contact of each capacitor of the second plurality of capacitors via the common connection line of array 206. Further, the switching logic 234 is configured to cause the switching array 222 to connect the second contact of each capacitor of the first and second plurality of capacitors to Vcm. Stated differently, the switching array 222 is configured to reset the second contacts of each capacitor of the first and second plurality of capacitors to Vcm.

According to the above configuration of ADC 202, a first bit of the digital output signal is determined from the output of the comparator 208. Specifically, the comparator 208 is configured to compare the two input signals provided on its inputs then determine which one is greater. Whether the first bit is a '1' or a '0' depends on which input signal is greater. The output of the comparator 208 is also provided to the switching logic 234. The switching logic 234 then controls the operation of the switching array 222 and reset switch 233 in dependence on the signal output from the comparator 208 during the conversion period described below. In an example embodiment, the first bit is the most significant bit of the digital output signal. Once the first bit is determined, the sampling period is over and the conversion period begins, which will be described next.

During the conversion period, the switching logic 234 is configured to cause the switching array 222 to connect each second contact of a first capacitor pair (i.e. the pair of capacitors labeled 'a') to a different one of the signals Vref_hi and Vref_lo, depending on the determination of the first bit in the sampling period. For example, the second contact of capacitor 'a' from the first plurality of capacitors may be connected to the first signal Vref_hi whilst the second contact of the capacitor 'a' from the second plurality of capacitors is connected to the second signal Vref_lo, or visa versa. The choice of which way round to connect the second contacts to the first signal Vref_hi and the second signal Vref_lo is made in dependence on the determination of the first bit which was performed during the sampling period. For example, if the first bit is determined to be a 1', the capacitor 'a' of the first plurality is connected to the first signal Vref_hi whilst the capacitor 'a' of the second plurality is connected to the second signal Vref_lo. Conversely, if the first bit is determined to be a '0', the capacitor 'a' of the first plurality is connected to the second signal Vref_lo whilst the capacitor 'a' of the second plurality is connected to the first signal Vref_hi.

Also during the conversion period, the switching logic 234 is configured to cause the switching array 222 to connect any succeeding capacitor pairs in capacitor pairs. In the instant case, there are nine pairs of succeeding capacitor pairs, i.e. capacitor pairs 'b' to 'j'. Therefore, the switching logic 234 causes the switching array 222 to connect each of capacitor pairs 'b' to 'j' in paired formation. In other words, the second contact of capacitors 'b' to 'j' of the first plurality is connected to the second contact of capacitors 'b' to 'j' of the second plurality, respectively. According to this configuration, it is possible to determine the second bit of the digital output signal from the output of the comparator 208. In an example embodiment, the second bit is the second most significant bit of the digital output signal. Once the second bit has been determined, the first conversion cycle of the conversion period is complete.

Figure 4:
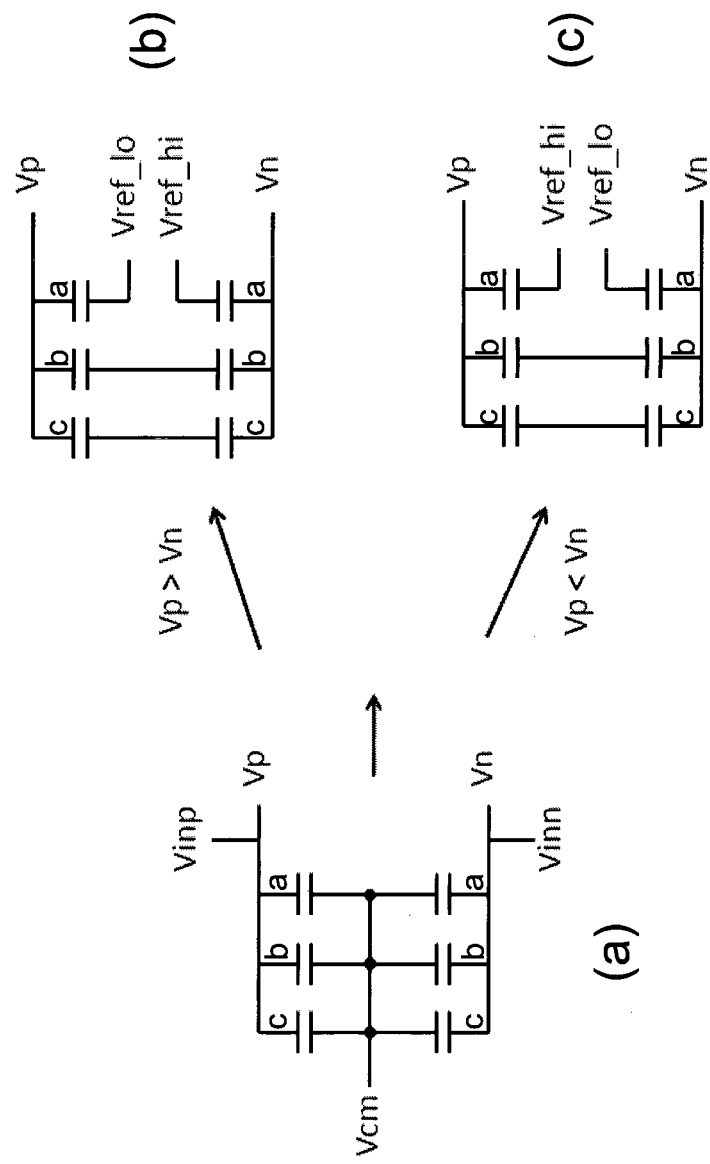
FIG. 4 is a schematic diagram illustrating an operation of the analogue-to-digital converter of FIG. 3.

FIG. 4 illustrates the above-described operation. FIG. 4a illustrates the sampling period, whereas FIGS. 4b and 4c illustrate alternative options for the first conversion cycle of the conversion period. Considering FIG. 4a, during the sampling period the first switchable input connection is switched so that the input signal (Vinp) present on the first switchable input connection is provided to the first contacts of the first plurality of capacitors. Additionally, the second switchable input connection is switched so that the input signal (Vinn) present on the second switchable input connection is provided to the first contacts of the second plurality of capacitors. Further, the switching logic 234 causes the switching array 222 and the reset logic 233 to reset the second contacts of the first and second plurality of capacitors to Vcm. In an example embodiment Vcm is equal to (Vref_hi+Vref_lo)/2. As described above, the first bit is then determined based on the output of the comparator 208. Also, the comparator output is provided to the switching logic 234 and used to control the switching array 222 and reset switch 233 during the first cycle of the conversion period.

During the first cycle of the conversion period, the second contacts of the first capacitor pair (the pair labeled 'a') of capacitors are switched to either Vref_hi or Vref_lo in dependence on the output of the comparator 208. As seen more particularly on FIG. 4, if the first comparator input is greater than the second comparator input, the arrangement of FIG. 4b is established. Alternatively, if the signal at the first comparator input is less than the second comparator input, the arrangement of FIG. 4c is established. In either case, all succeeding capacitor pairs (i.e. pairs labeled 'b' to 'j') are connected together in pairs. It is noted that only three of the capacitor pairs ('a' to 'c') are shown in FIG. 4. By connecting the succeeding capacitor pairs in paired formation (i.e. by connecting their second contacts together) a virtual Vcm voltage is created at the second contacts of the capacitors in this paired formation. In an example embodiment, the virtual Vcm equals (Vref_hi+Vref_lo)/2. According to this operation, the second bit of the digital output signal can be determined from the output of the comparator 208. During determination of the second bit, the capacitor pair labeled 'a' is maintained in the configuration which was established following determination of the first bit.

The following describes how the conversion period continues to determine the third and subsequent bits of the digital output signal during second and subsequent conversion cycles.

The switching logic 234 is configured to cause the switching array 222 to connect each second contact of the second capacitor pair (i.e. the pair of capacitors labeled 'b') to a different one of Vref_hi and Vref_lo, depending on the determination of the second bit in the first cycle of the conversion period. For example, the second contact of capacitor 'b' from the first plurality of capacitors may be connected to the first signal Vref_hi whilst the second contact of the capacitor 'b' from the second plurality of capacitors is connected to the second signal Vref_lo, or visa versa. The choice of which way round to connect the second contacts to the first signal Vref_hi and the second signal Vref_lo is made in dependence on the determination of the second bit which was performed above. For example, if the second bit is determined to be a '1', the capacitor 'b' of the first plurality is connected to the first signal Vref_hi whilst the capacitor 'b' of the second plurality is connected to the second signal Vref_lo. Conversely, if the first bit is determined to be a '0', the capacitor 'b' of the first plurality is connected to the second signal Vref_lo whilst the capacitor 'b' of the second plurality is connected to the first signal Vref_hi.

The switching logic 234 is configured to cause the switching array 222 to connect any succeeding capacitor pairs in capacitor pairs. In the instant case, there are eight pairs of succeeding capacitor pairs, i.e. capacitor pairs 'c' to 'j'. Therefore, the switching logic 234 causes the switching array 222 to connect each of capacitor pairs 'c' to 'j' in paired formation. In other words, the second contact of capacitors 'c' to 'j' of the first plurality is connected to the second contact of capacitors 'c' to 'j' of the second plurality, respectively. According to this configuration, it is possible to determine the third bit of the digital output signal from the output of the comparator 208. In an embodiment, the third bit is the third most significant bit of the digital output signal. During determination of the third bit, the capacitor pair labeled 'a' is maintained in the configuration which was established following determination of the first bit. Additionally, during determination of the third bit, the capacitor pair labeled 'b' is maintained in the configuration which was established following determination of the second bit.

Considering the above description of the formation of the first, second and third bits of the digital output signal, the skilled person would understand how to extend the operation of the ADC 202 to generate all remaining bits of the digital output signal. Once all bits of the digital output signal have been determined the conversion period is complete. Furthermore, at this time, the complete digital output signal corresponding to the analogue input signal has been determined.

The switching array 222 as controlled by the switching logic 234 reduces the number of capacitors required to form the digital output signal. Additionally, the switching array 222 as controlled by the switching logic 234 reduces the number of conversion cycles that need to be performed during the conversion period. Specifically, according to the above-described operation of the ADC 202, the input signals are sampled directly onto the first contacts of the first and second plurality of capacitors. According to this operation, it is possible to determine the first bit during the sample period, i.e. before the conversion period. Accordingly, one conversion cycle of the conversion period is saved since the first bit does not need to be determined during the conversion period. This means that it is not necessary to include a capacitor pair in the first and second plurality of capacitors for determining the first bit, thereby reducing the number of capacitors required. Furthermore, this means that time is not spend during the conversion period determining the first bit, since the first bit is determined during the sampling period which would occur in any case. Accordingly, the number of conversion cycles is reduced, thereby shortening the duration of the conversion period.

The reset switch 233 as controlled by the switching logic 234 regulates the third signal Vcm level of the capacitor array after each conversion of an analogue input signal to a digital output signal. Without such regulation, the third signal Vcm may be subject to variation under long term operation if the charge from previous conversions is not completely discharged. Therefore, the reset switch reduces variation of the third signal Vcm from one conversion period to the next. Reducing the variation of the third signal Vcm improves reliability of the ADC during long-term operation, which may be particularly relevant to certain applications, such as, for example, biomedical applications.

In an example embodiment, setting the second contact of each capacitor in the first and second plurality of capacitors to the third signal Vcm is achieved by activating one reset switch, i.e. the reset switch performs a common-mode reset. This operation reduces the switching activity as well as the power consumed by each switching operation since activating a single switch sets each second contact to the third signal Vcm. Stated differently, each second contact does not need to be individually switched to the third signal Vcm.

In an example embodiment, during the conversion period, the first contact of each capacitor of the first plurality of capacitors (i.e. capacitors 'a' to 'j' of array 204) is coupled to the first input terminal of the comparator 208. Additionally, the first contact of each capacitor of the second plurality of capacitors (i.e. capacitors 'a' to 'j' of array 206) is coupled to the second input terminal of the comparator 208. Additionally, in an example embodiment, during the conversion period, the first and second switchable input connections 218 and 220 are switched to the 'off' configuration and, therefore, do not provide an input signal to the arrays 204 and 206, or the comparator 208.

In an example embodiment, a non-binary redundant algorithm is applied to capacitors of the first capacitor array 204 and the second capacitor array 206. The redundant algorithm introduces extra bits to correct any conversion error that occurs during the process of converting an analogue input signal into a digital output signal. The redundant algorithm utilizes different step sizes instead of a standard step size for each bit conversion in order to obtain an optimum step size pattern which provides the best tolerable error range. The application of redundant algorithm can relax (i.e. reduce) the settling time requirement of the first few bits. If the reduction in the settling time required is greater than the increase of the conversion steps and capacitors, the overall power consumption of the ADC can be reduced. As mentioned above, the switching array 222 reduces the number of capacitors and conversion cycles and, thereby, relaxes the timing requirement of the comparator. In an example embodiment, the settling time of the ADC can be expressed as $$\text{Settling time} = \ln\left(\frac{p}{q}\right)\tau,$$

where p is the step size of the reference voltage change from previous bit, q is the redundancy in the corresponding step, and r is the time constant of the capacitor array.

In an example embodiment, a redundant algorithm can optimize the settling time of the ADC. In an embodiment, one redundant bit is utilized for a 10 bit ADC design. After a simulation, the redundant code pattern is chosen to be $X_i \in \{238, 125, 68, 37, 20, 11, 5, 4, 2, 1\}$ where i=10:0, which gives the best settling time of $2.2\tau$. In an example embodiment, an attenuating capacitor is utilized to reduce the size of the capacitors.

In an example embodiment, an ADC 202 for converting an analogue input signal into an N-bit digital signal with M redundant bits needs first and second pluralities of capacitors each containing N+M capacitors. According to this arrangement, it takes N+M conversion cycles to complete the conversion.

Figure 5:
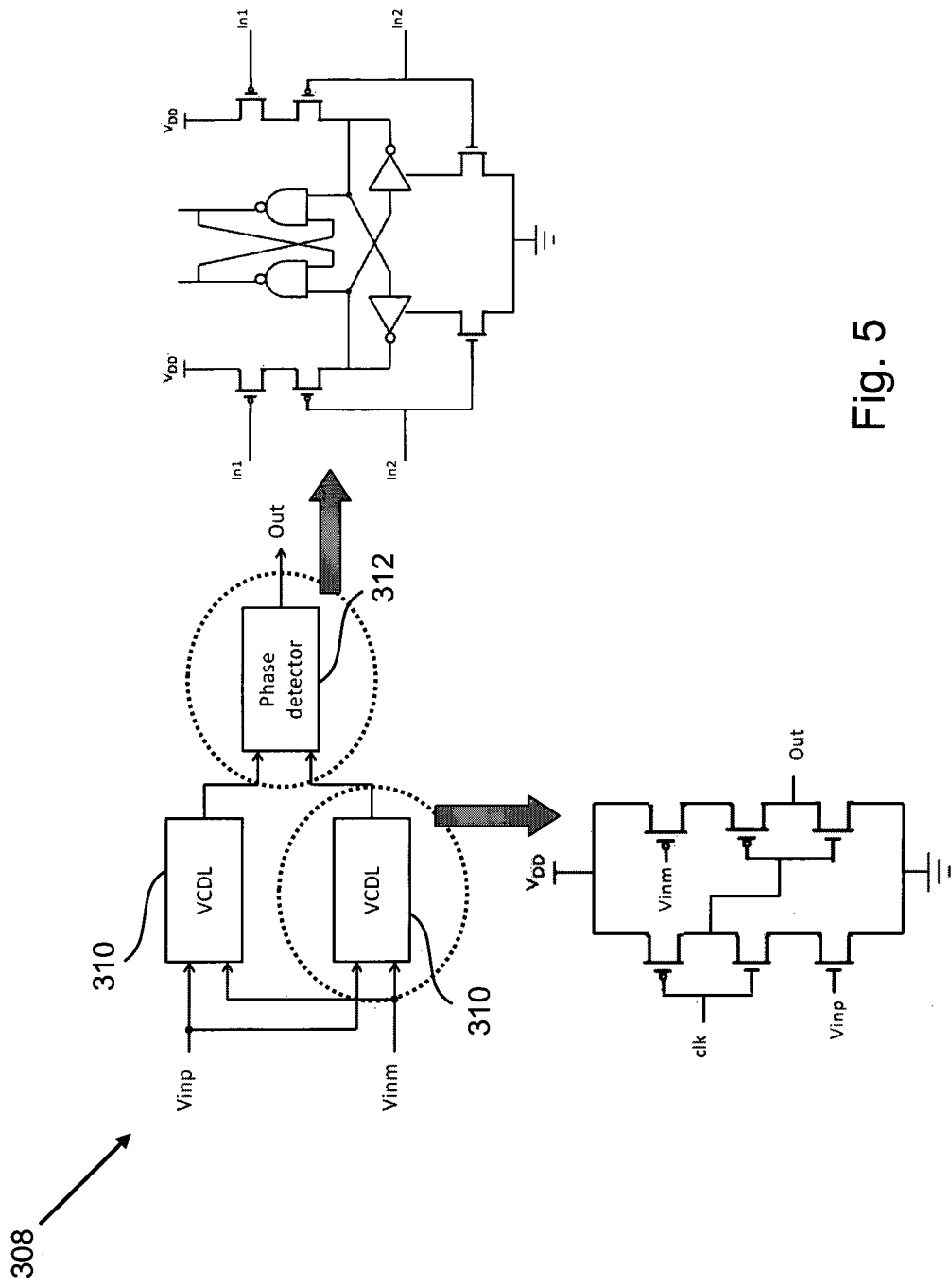
FIG. 5 is a schematic diagram of a comparator according to an example embodiment.

In an example embodiment, the comparator 208 is a time-domain comparator 308. The time-domain comparator 308 is utilized to further reduce the power consumption of the ADC 202. As seen more particularly on FIG. 5, the time-domain comparator 308 is composed of a plurality of stages of voltage controlled delay circuits 310. Each stage converts input voltage levels into corresponding delays of a clock signal. In the example embodiment of FIG. 5, two input voltage levels Vinp and Vinm are each converted into a delay of a clock signal (clk). The time-domain comparator 308 is further composed of a phase detector circuit 312 which determines which of the converted input voltage levels changes earlier, i.e. which one of converted Vinp or converted Vinm is delayed the most. In other words, the time-domain comparator converts each voltage signal to a pulse width and compares the duration of the pulses. The time-domain comparator is a fully digital circuit. The time-domain comparator does not consume any static power and is able to operate with a low supply voltage. In an example embodiment, the time-domain comparator 308 may include five stages of voltage controlled delay 310. It is to be understood that in some other example embodiments, the comparator 308 may include a different number of stages, for example, a number greater than or less than five. It is further noted that the switching array 222 as controlled by the switching logic 234 relaxes the timing requirement of the time-domain comparator 308. Hence, power consumption of the ADC 202 is reduced.

Figure 6:
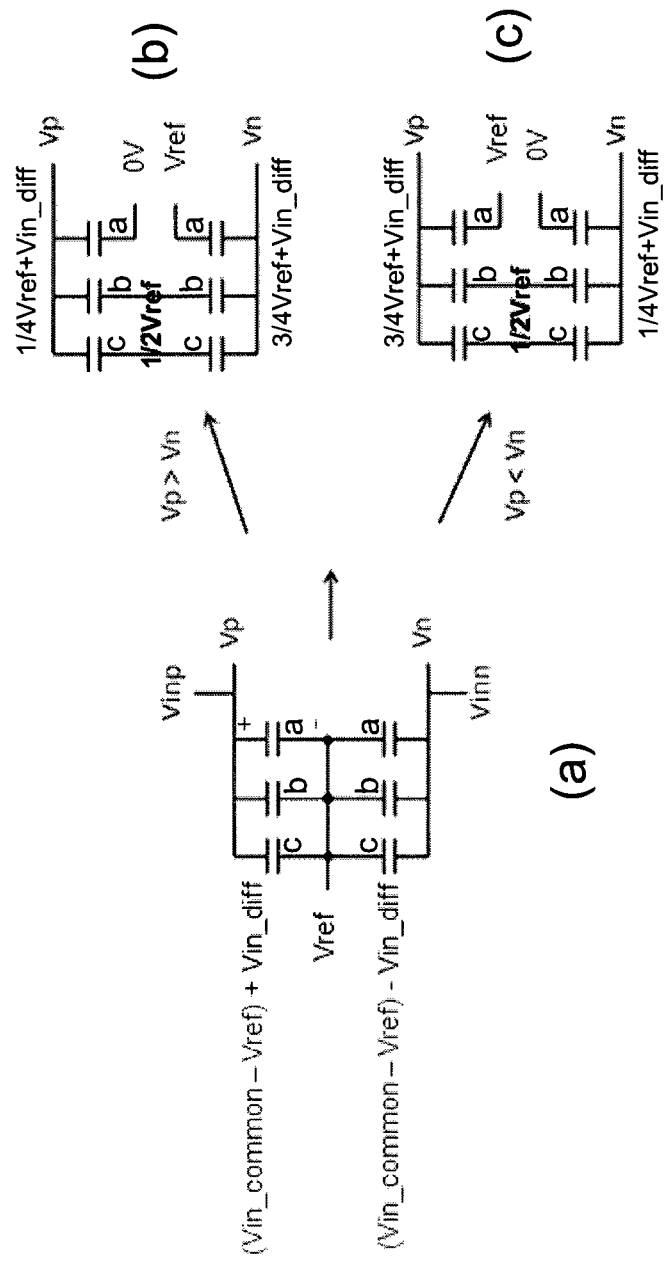
FIG. 6 is a schematic diagram illustrating an operation of the analogue-to-digital converter of FIG. 3.

FIG. 6 illustrates an example embodiment. FIG. 6 corresponds with the above-described FIG. 4. FIG. 6 illustrates how an example embodiment avoids using a separately generated third voltage level. It is desirable to avoid using a separately generated third voltage level to eliminate the need for a high-power low-impedance buffer which would increase the overall power requirement of the ADC. According to the example embodiment of FIG. 6, Vref_lo is set to 0V, and Vref_hi is set to a reference voltage Vref. In an example embodiment, Vref is equal to the input common mode voltage (Vin_common) which is described below.

During the sampling period, the second contacts of the first and second plurality of capacitors are connected to Vref while the first contacts sample the input voltage. In this configuration, the voltage stored on the first and second plurality of capacitors contains a common mode term (Vin_common) and a differential term (Vin_diff). As the input common mode voltage (Vin_common) is equal to Vref, the common mode voltage stored on the first and second plurality of capacitors is zero. Therefore, only the differential input voltage is stored. As described above, after making the first bit decision, during the conversion period the second contacts of the first pair of capacitors (labeled 'a' in FIG. 3) are switched to either Vref or 0V in dependence on the first bit decision. In this example embodiment, the first plurality of capacitors is identical to the second plurality of capacitors. Therefore, the charge redistribution will create a virtual ½Vref (i.e. Vref/2) at the second contacts of each successive capacitor pair (labeled 'b' to 'j' in FIG. 3). It is noted that this virtual voltage value matches the corresponding virtual voltage value mentioned above in reference to FIG. 4. Further, as seen on FIG. 6b, during one of the possible conversion cycles relating to the first bit, the voltage present on the first contact of each capacitor of the first plurality is ¼Vref+Vin_diff, whereas the voltage present on the first contact of each capacitor of the second plurality is ¾Vref+Vin_diff. Furthermore, as seen on FIG. 6c, during the alternative conversion cycle relating to the first bit, the voltage present on the first contact of each capacitor of the first plurality is ¾Vref+Vin_diff, whereas the voltage present on the first contact of each capacitor of the second plurality is ¼Vref+Vin_diff.

In view of the above, there is no need to separately generate a third voltage level and after every conversion cycle, the Vcm is fixed. Stated differently, by designing the input common mode voltage (Vin_common) to be equal to Vref, there is no need to separately generate a third voltage level. Furthermore, the example embodiment of FIG. 6 achieves this by pre-charging the capacitors of the first and second plurality with a third voltage before decision making. Accordingly, the third voltage is not separately generated, but instead is achieved by balancing the charge between the two capacitor arrays 204 and 206. This operation reduces the power demand of the ADC by eliminating the need for a high-power low-impedance buffer for holding the third voltage. A typical buffer can consume up to 10 uW of power.

In an example embodiment, the capacitors of the first and second plurality of capacitors are charged in one step during the sampling period. Accordingly, the time taken to convert an analogue input signal into a digital output signal is not prolonged by charging the capacitors in multiple steps.

In an example embodiment, the additional power consumed by the reset switch during operation is less than 1% of the total power, i.e. it is negligible. Furthermore, in an example embodiment, the ADC 202 has a fully differential structure and complementary switches which reduces charge injection caused by input sampling at the first contacts of the first and second plurality of capacitors.

In an example embodiment, the ADC is a successive approximation (SAR) ADC. In an example embodiment, at least one of the capacitors of the first and second plurality of capacitors is a metal-oxide-metal (MOM) capacitor. In an example embodiment, each capacitor of the first and second plurality of capacitors is a metal-oxide-metal (MOM) capacitor.

In an example embodiment, the switching array is a tri-level switching array, wherein the 'tri-level' aspect relates to three voltage levels which may be applied to the second contact of capacitors in the first and second plurality of capacitors. Specifically, the three levels may be Vref_hi, Vcm and Vref_lo. Also, the three levels may be Vref_1, Vcm and Vref_2.

Various experiments were performed on different example embodiments.

One example embodiment may include a 10-bit 100 kS/s redundant SAR ADC.

Figure 7:
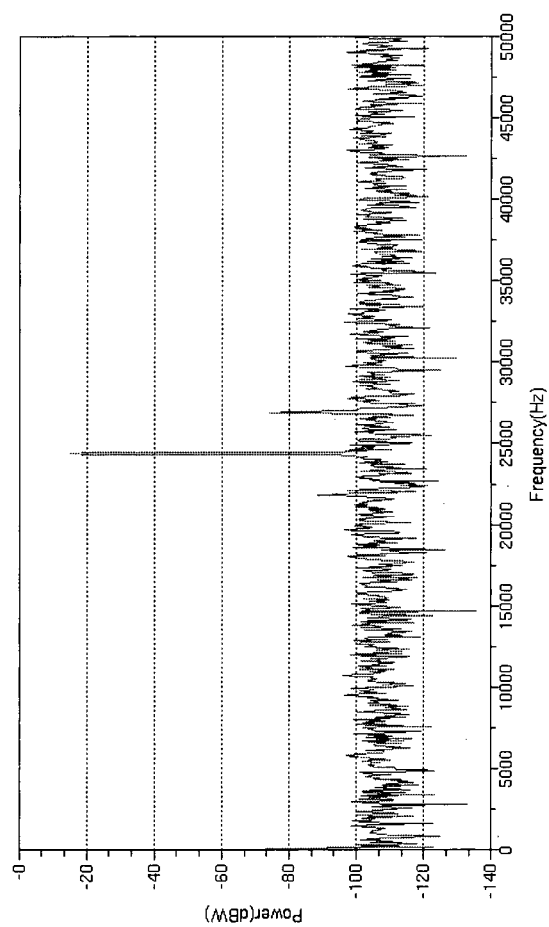
Figure 8:
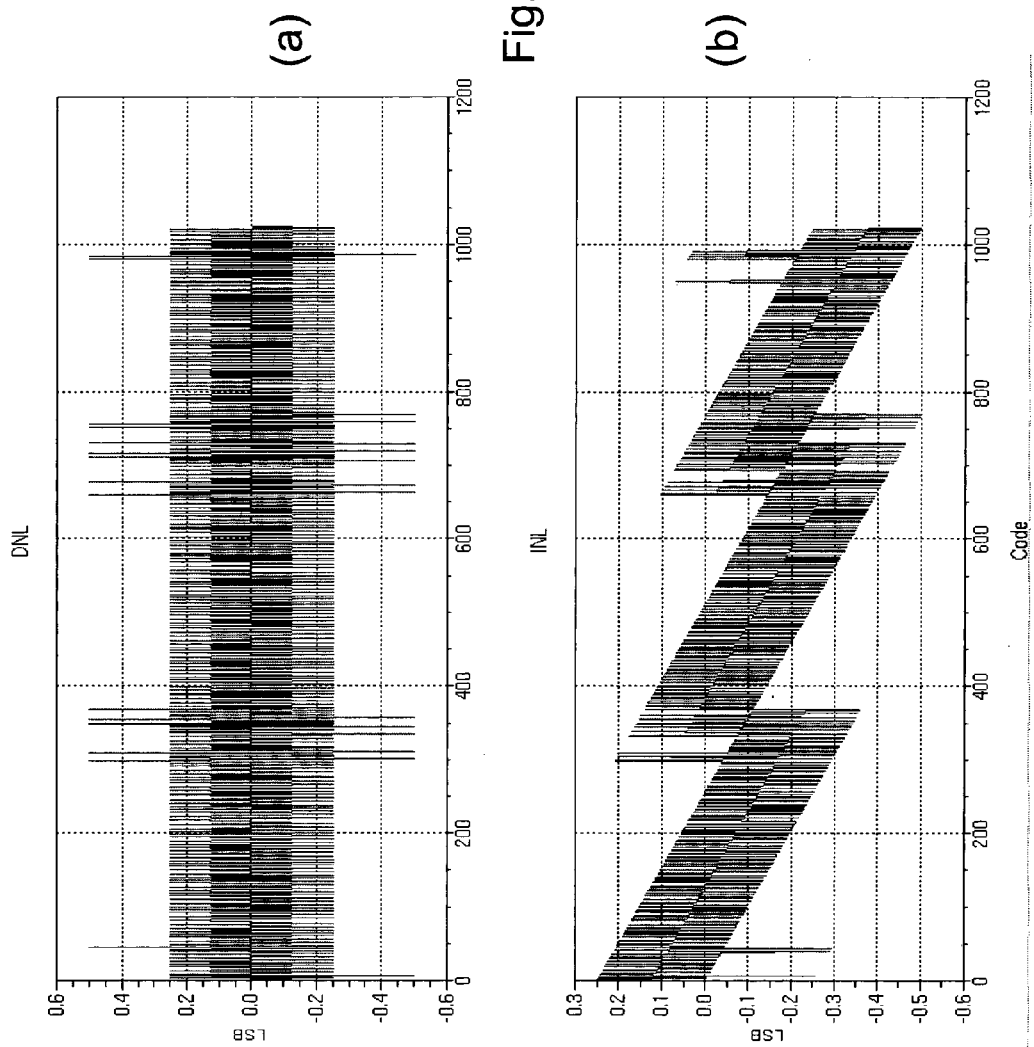

The SAR ADC was developed using a 0.18 µW CMOS process. FIG. 7 shows the output spectrum of the SAR ADC with a 24 kHz input signal. FIGS. 8a and 8b show differential non-linearity (DNL) and integral non-linearity (INL) plots, respectively, of the SAR ADC. The DNL is less than ±0.5 LSB and the INL is less than ±0.5 LSB. FIG. 9 provides a table summarizing the SAR ADC performance. The simulated performance of the SAR ADC is shown in the table of FIG. 10 compared to known SAR ADCs. It can be seen that the SAR ADC achieves an effective number of bits (ENOB) of 8.5 bits while consuming only 0.7 µW of power. Therefore, the example embodiment SAR ADC achieves ultra-low power consumption. Moreover, it achieves a figure of merit (FOM) of 19 fJ/conversion step. Additionally, in a separate simulation, the 10-bit 100 kS/s redundant SAR ADC with a 24 kHz input signal produced a signal-to-noise and distortion-ratio (SNDR) of 52.48 dB, a spurious-free dynamic range (SFDR) of 60 dB, an effective number of bits (ENOB) of 8.4 bits and consumed 0.4 µW of power.

Figure 11:
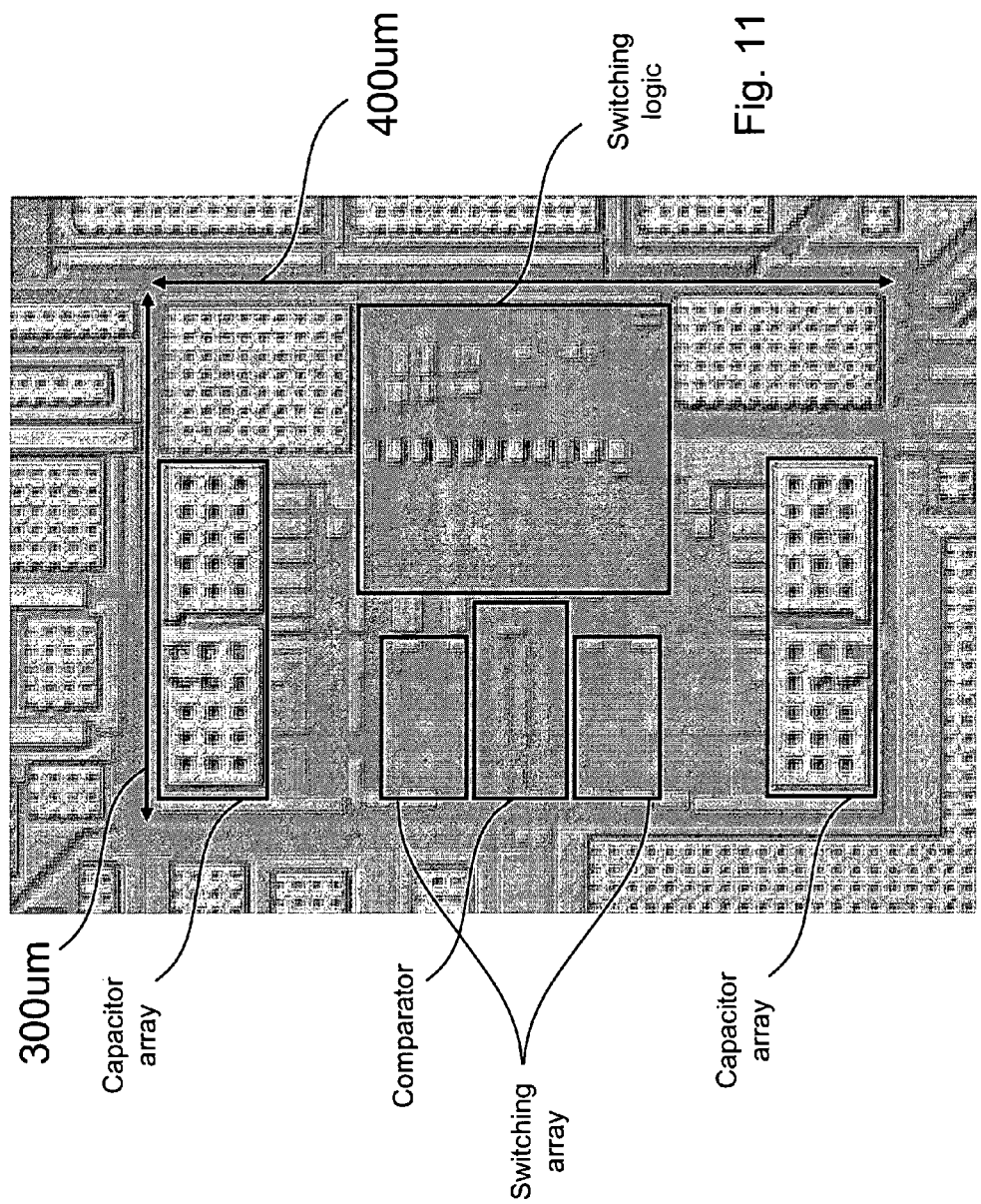
Figure 12:
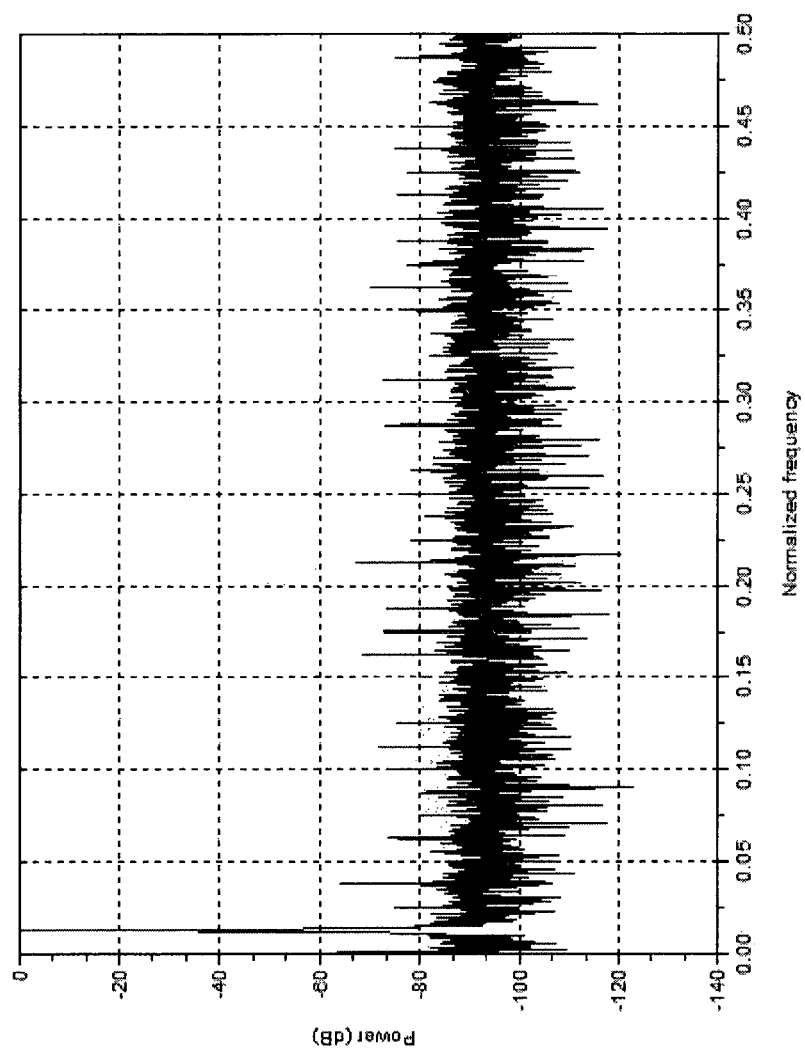
Figure 13:
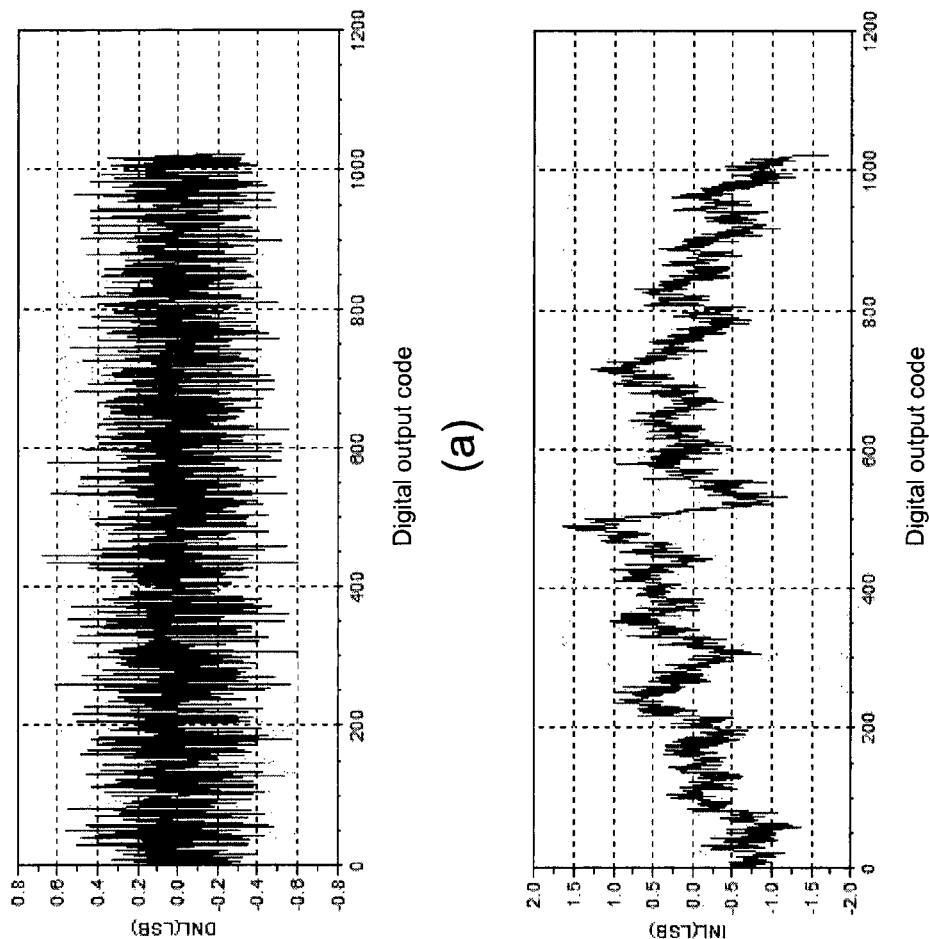
Figure 14:
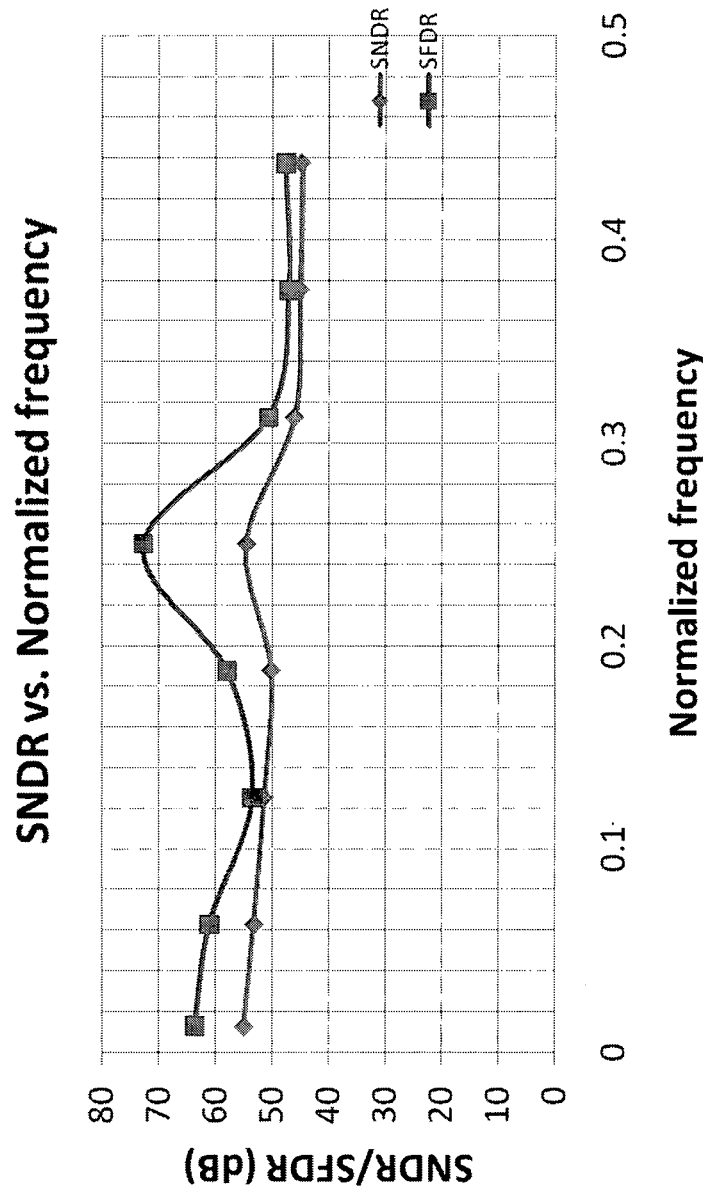
Figure 15:
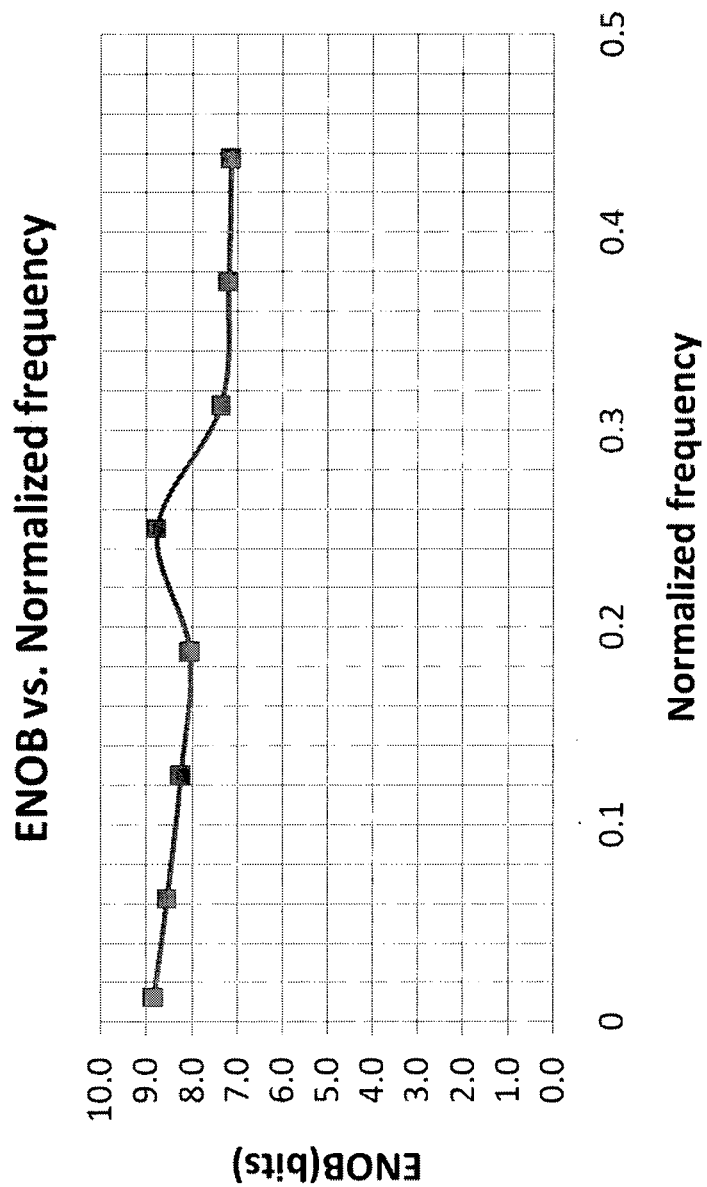

Another example embodiment may include a 10-bit 80 kS/s redundant SAR ADC. The SAR ADC was developed using a 0.18 µW CMOS process. FIG. 11 is a chip micrograph of the SAR ADC. FIG. 12 shows the output spectrum at 80 kS/s. FIGS. 13a and 13b show the DNL and INL plots, respectively, of the SAR ADC at 80 kS/s. The SAR ADC has a DNL and INL that are less than 0.7 LSB and 1.5 LSB, respectively, at 10-bit resolution. FIG. 14 shows the SNDR and the SFDR of the SAR ADC for input frequencies from DC to Nyquist frequency. FIG. 15 shows the ENOB of the SAR ADC for input frequency from DC to Nyquist frequency. The ADC achieves 8.6-bit ENOB at low frequency and it drops to 7.1 bit at high frequency. FIG. 16 provides a table summarizing the SAR ADC performance. Additionally, in a separate simulation, the SAR ADC achieved an ENOB of 8 bits up to 20 kHz input while consuming only 0.4 µW of power. The SAR ADC occupied 0.12 mm² of active area. The SAR ADC achieved an FOM of 19.5 fJ/conversion-step. The SAR ADC consumed 0.4 µW at 1V supply, which corresponds to an FOM of 19.5 fJ/conversion step, which is, to the inventor's knowledge, the best FOM achieved by SAR ADC designed using 0.18 µm process.

In a further example embodiment, a redundant SAR ADC was developed using a 65 nm CMOS process. The supply voltage was therefore scaled down to 0.6V, whilst the number of capacitors was scaled by a factor of ten. A reduction in the dynamic power was seen in accordance with the following expression $P \propto CV^2f$. An increase in the leakage power was seen due to a lower voltage threshold ($V_{th}$). Compared to a 0.18 µW CMOS process ADC, capacitor power consumption reduced from 0.21 µW to 0.06 µW; logic power consumption reduced from 0.21 µW to 0.11 µW; and, comparator power consumption reduced from 0.27 µW to 0.15 µW. This lead to an overall drop in power consumption from 0.69 µW to 0.32 µW. Furthermore, a drop in FOM from 19 fJ/step to 8.8 fJ/step was also observed. Therefore, using a 65 nm CMOS process resulted in a power reduction of more than 50% compared with using a 0.18 µW CMOS process.

In an example embodiment, the ADC forms part of a medical device. In an example embodiment, the ADC forms part of an integrated circuit. The integrated circuit may be an application specific integrated circuit (ASIC), and may form part of a medical device. For example, the ADC may form part of a data converter element within a sensor interface and signal processing subsystem of a medical device. According to the present example embodiment, 'a medical device' is taken to mean an electronic device, a part of an electronic device or a group of electronic devices suitable for use with a human or animal body. For example, the medical device may be implantable in a body, partially implantable in a body or positioned on or adjacent to a body. In an example, a medical implant may include an implantable blood flow sensor for sensing blood flow through an implanted prosthetic vascular graft. An example embodiment of the ADC may be particularly suitable for use in a medical device because of having a low power requirement, and in particular, an ultra-low power requirement. Accordingly, an example embodiment may be suitable for micro-power applications, i.e. applications in which power consumption is at a level between 1 µW to 10 µW. For battery-powered micropower medical implants, it is desirable that an ADC consumes less than 1 µW of power, since this will increase the lifetime of the device. For battery-less medical devices, it is desirable that an ADC consumes less than 1 µW of power, since this will enable acquisition of energy from energy harvesting techniques. An example embodiment is suitable for use in a battery-power micro-power medical implant. An example embodiment is suitable for use in a battery-less medical device.

While the invention has been particularly shown and described with reference to specific example embodiments, it should be understood by those skilled in the art that various changes in form and detail may be made without departing from the spirit and scope of the invention as defined by the appended claims. The scope of the invention is thus indicated by the appended claims and all changes which come within the meaning and range of equivalency of the appended claims are therefore intended to be embraced.

The invention claimed is:

1. An analogue-to-digital converter for converting an analogue input signal into a digital output signal, the analogue-to-digital converter comprising:
a first input connection configured to receive a first part of the analog input signal;
a second input connection configured to receive a second part of the analogue input signal;
a first plurality of capacitors and a second plurality of capacitors, each capacitor of the first and second plurality of capacitors having a first contact and a second contact, each capacitor of the first plurality of capacitors having a corresponding capacitor in the second plurality of capacitors to form a plurality of capacitor pairs;
a switching array coupled to the second contact of each capacitor in the first and second plurality of capacitors; and,
switching logic for controlling the switching array;
wherein, during a sampling period of the analogue-to-digital converter, the first input connection is configured to couple the first part of the analogue input signal to the first contact of each capacitor of the first plurality of capacitors, the second input connection is configured to couple the second part of the analogue input signal to the first contact of each capacitor of the second plurality of capacitors, and the switching logic is configured to cause the switching array to couple the second contact of each capacitor of the first and second plurality of capacitors to a common mode voltage to determine a first bit of the digital output signal.

2. The analogue-to-digital converter of claim 1, wherein, during a conversion period of the analogue-to-digital converter, the switching logic is configured to cause the switching array to couple each second contact of at least one capacitor pair to a different one of a first and a second reference voltage, and to couple the other capacitors in capacitor pairs via their second contacts to determine subsequent bits of the digital output signal.

3. The analogue-to-digital converter of claim 2, wherein, during the conversion period of the analogue-to-digital converter, the switching logic is configured to cause the switching array to couple each second contact of a first capacitor pair to a different one of the first and the second reference voltage depending on the determination of the first bit of the digital output signal, and to couple in pairs any succeeding capacitor pairs to determine a second bit of the digital output signal.

4. The analogue-to-digital converter of claim 3, wherein, during the conversion period of the analogue-to-digital converter, the switching logic is configured to cause the switching array to couple each second contact of an ith capacitor pair to a different one of the first and the second reference voltage depending on a determination of an ith bit of the digital output signal, and to couple in pairs any succeeding capacitor pairs to determine an (i+1)th bit of the digital output signal.

5. The analogue-to-digital converter of claim 2, wherein, during the conversion period of the analogue-to-digital converter, the first input connection is configured to decouple the first part of the analogue input signal from the first contact of each capacitor of the first plurality of capacitors, the second input connection is configured to decouple the second part of the analogue input signal from the first contact of each capacitor of the second plurality of capacitors.

6. The analogue-to-digital converter of claim 1, wherein the switching array is configured to selectively couple the second contact of each capacitor in the first plurality of capacitors to one of the first reference voltage, the second reference voltage, the common mode voltage and its corresponding capacitor in the second plurality of capacitors, and to selectively couple the second contact of each capacitor in the second plurality of capacitors to one of the first reference voltage, the second reference voltage, the common mode voltage, and its corresponding capacitor in the first plurality of capacitors.

7. The analogue-to-digital converter of claim 1, further comprising a comparator having a first input terminal coupled to the first contact of each capacitor of the first plurality of capacitors, and a second input terminal coupled to the first contact of each capacitor of the second plurality of capacitors.

8. The analogue-to-digital converter of claim 7, wherein the comparator further comprises an output, wherein the switching logic is configured to control the switching array in dependence on the comparator output.

9. The analogue-to-digital converter of claim 8, wherein the analogue-to-digital converter is configured to determine bits of the digital output signal in dependence on the comparator output.

10. The analogue-to-digital converter of claim 7, wherein the comparator is a time-domain comparator comprising voltage controlled delay circuitry configured to convert a voltage level of the time-domain comparator to a delay of a clock signal, and phase detection circuitry configured to determine which of the signals input on the first input terminal and the second input terminal changes earlier.

11. The analogue-to-digital converter of claim 1, wherein the first plurality of capacitors comprises capacitance values in a non-binary weighted relationship.

12. The analogue-to-digital converter of claim 1, wherein the second plurality of capacitors comprises capacitance values in a non-binary weighted relationship.

13. The analogue-to-digital converter of claim 1, wherein both capacitors of a capacitor pair have the same capacitance.

14. The analogue-to-digital converter of claim 2, wherein the digital output signal comprises N bits and each of the first plurality of capacitors and the second plurality of capacitors comprise more than N+1 capacitors to provide redundancy.

15. The analogue-to-digital converter of claim 1, wherein the second reference voltage is ground.

16. The analogue-to-digital converter of claim 1, further comprising a reset switch, wherein the switching logic is configured to cause the reset switch to regulate the common mode voltage.

17. The analogue-to-digital converter of claim 1, wherein the first bit is a most significant bit of the digital output signal.

18. The analogue-to-digital converter of claim 1, wherein the first part of the analogue input signal and the second part of the analogue input signal comprise the analogue input signal in differential form.

19. The analogue-to-digital converter of claim 18, wherein the first reference voltage is selected to be equal to a common mode voltage of the analogue input signal in differential form, such that capacitors that are coupled in pairs have a value of half of the first reference voltage at their second contact during the conversion period.

20. An integrated circuit comprising the analogue-to-digital converter of claim 1.

\* \* \* \* \*